United States Patent [19]

Thorpe et al.

[11] Patent Number: 4,715,116

[45] Date of Patent: Dec. 29, 1987

[54] PRODUCTION OF DIELECTRIC BOARDS

[75] Inventors: John E. Thorpe, North Shields; Gursharan S. Sarang, Ponteland, both of England

[73] Assignee: M&T Chemicals Inc., Woodbridge, N.J.

[21] Appl. No.: 770,290

[22] PCT Filed: Dec. 19, 1984

[86] PCT No.: PCT/GB84/00441

§ 371 Date: Oct. 21, 1985

§ 102(e) Date: Oct. 21, 1985

[87] PCT Pub. No.: WO85/02969

PCT Pub. Date: Jul. 4, 1985

[30] Foreign Application Priority Data

Dec. 19, 1983 [GB]  United Kingdom ................ 8333753

[51] Int. Cl.$^4$ .............................................. H05K 3/10
[52] U.S. Cl. .................................... 29/846; 156/233; 204/13; 428/901
[58] Field of Search .................... 29/846, 847, 848; 156/150, 151, 233; 204/13

[56] References Cited

U.S. PATENT DOCUMENTS

| | | | |
|---|---|---|---|
| 2,874,085 | 2/1959 | Brietzke | 156/233 X |
| 3,230,163 | 1/1966 | Dreyfus | 151/151 X |
| 3,324,014 | 6/1967 | Modjeska | 29/848 X |
| 3,532,587 | 10/1970 | Ungar et al. | 156/233 X |
| 3,990,926 | 11/1976 | Konicek | 204/13 X |
| 4,053,370 | 10/1977 | Yamashita et al. | 204/13 |
| 4,073,699 | 2/1978 | Hutkin | 209/13 |
| 4,313,995 | 2/1982 | Delgadillo | 428/901 X |

FOREIGN PATENT DOCUMENTS

| | | | |
|---|---|---|---|
| 44930 | 4/1975 | Japan | 204/52.1 |
| 47811 | 11/1978 | United Kingdom | 204/52.1 |

*Primary Examiner*—Howard N. Goldberg
*Assistant Examiner*—Carl J. Arbes
*Attorney, Agent, or Firm*—S. H. Parker; R. Bright

[57] ABSTRACT

Copper substantially free of micro-pores is electrodeposited on a polished surface of a stainless steel, titanium, or chromium-plated steel press plate. The copper layer is then provided with a matte surface of copper of dendritic structure which is subsequently bonded to a dielectric material under the application of heat and pressure in a laminating press. The resulting copper-clad dielectric board separates from the press plate, which can then be re-used.

12 Claims, No Drawings ated base material, and placing the two materials between press plates on a laminating press. Under heat and pressure the partially cured resin adheres to the copper foil so that, when removed from the press, the two materials are firmly bonded together.

PRODUCTION OF DIELECTRIC BOARDS

TECHNICAL FIELD

This invention relates to a process for producing copper-clad dielectric boards and to material for use in such a process.

BACKGROUND ART

The background to the invention is as follows. Copper clad laminates are at present manufactured by taking copper foil produced generally in accordance with the teaching of U.S. Pat. No. 3,674,656, laying it on top of one or more sheets of partially cured resin impregnated base material, and placing the two materials between press plates on a laminating press. Under heat and pressure the partially cured resin adheres to the copper foil so that, when removed from the press, the two materials are firmly bonded together.

Such copper foil as is used in this process is available in unsupported form in a thickness range of 9 μm upwards to in excess of 105 μm. Since such foil is frequently in excess of 1 meter wide, handling sheets of it can be difficult and, particularly in thicknesses between 9 and 20 μm, a great deal of scrap is generated in the laying up process. In order to preserve the surface quality of the laminate great care has to be taken to exclude all dust particles from between the surface of the copper foil and the press plates, which are used to separate the laminates in the press during manufacture.

In order to facilitate the handling of thin copper foils it has been proposed to manufacture such materials by continuously depositing such copper onto a carrier foil of aluminium of chromium-plated copper and processes for so doing are disclosed in U.S. Pat. No. 4,113,576 and U.K. Patent Specification Nos. 1,460,849, 1,458,260, and 1,458,259. In practice foils produced by these techniques are costly and unreliable and have found little favour in the industry.

U.S. Pat. No. 3,984,598 describes a process in which a stainless steel press plate known as a caul plate is coated with a silane as a release agent and is then electroplated with copper. The exposed surface of the copper is then oxidised and treated with a silane as a bonding agent. The copper-clad caul plate is then laminated to resin-impregnated base material in a laminating press. After the laminate is removed from the press, the caul plate is removed from the copper-clad dielectric board which has been produced. The copper coating is found to have a variable thickness of about 5 to 12 μm.

It is notoriously difficult to uniformly electroplate a surface provided with an organic parting layer such as silane. As a result, the deposit will suffer from porosity. During laminating, the resin will therefore seep through the pores, both causing adherence to the caul plate and contaminating the surface of the laminate.

What is desired is a method by which thin copper layers of 3 microns and upwards can be successfully and economically laminated to dielectric base materials with great reliability.

DISCLOSURE OF THE INVENTION

The present invention provides a process for producing copper-clad dielectric boards, comprising the sequential steps of (a) depositing a layer of copper substantially free of micro-pores directly on a polished surface of a flat metallic press plate;

(b) providing the copper layer with a matte surface of copper of dendritic structure;

(c) bonding the matte surface to a dielectric material while applying heat and pressure to the press plate and the dielectric material in a laminating press and subsequently allowing the press to cool, the forces generated at the interface of the press plate and the copper layer, owing to the penetration of the dielectric material into the dendritic structure under pressure and the subsequent cooling of the dielectric material, being sufficient to overcome the adhesion of the copper layer to the polished surface of the press plate and thereby to cause the copper layer to be detached from the press plate;

(d) removing the resulting copper-clad dielectric board from the press and separating it from the press plate; and (e) returning the press plate to step (a) and repeating steps (a) to (d).

One or both of the surfaces of the press plate may be used.

BEST MODE FOR CARRYING OUT THE INVENTION

In the preferred process the press plate is 1.5 to 3 mm thick and is made of stainless steel, titanium, or chromium-plated steel. The press plate is polished by an abrasive brush or spray to provide a uniform finish of a surface roughness not exceeding 0.2 μm (preferably 0.1 μm) centre line average (C.L.A.).

After polishing, all traces of abrasive and products of abrasion are removed by washing.

The polished press plate is immersed in a copper plating bath vertically disposed and parallel to a suitable anode where it is rendered cathodic. A current is applied so as to plate on the press plate a fine grain copper deposit substantially free of micro-pores. The so plated press plate is removed from the bath, washed, and placed in a strong copper sulphate bath, again vertically and parallel to an anode. By controlling the conditions in this bath a further copper layer is deposited in such a way as to cause a somewhat coarser crystalline layer to be deposited on the fine grain deposit already present.

Subsequent plating in further copper baths under controlled conditions can be carried out to create a microcrystalline dendritic structure which has a high surface area suitable for bonding to typical dielectric base materials. When the plating sequence is complete the copper plated press plate is washed, passivated in weak chromic acid, washed again, and dried.

The plate is then taken to a laminating press and laid on top of suitable base material such as epoxy resin impregnated glass cloth. When the laminating press is closed and heat is applied, the resin in the base material is forced into the microcrystalline dendritic structure of the copper. During the subsequent cooling of the resin there is created a sufficient force to disturb the adhesion between the copper and the carrier plate so that when the press is opened it will be found that the copper layer is completely detached from the carrier plate and is firmly adherent to the base. If the plating conditions in the first bath are properly related to the surface texture of the carrier plate, the detachment of the copper happens so cleanly that the plate can immediately be passed through the plating cycle again.

Such a method of making laminates avoids completely the hazard of reeling and unreeling rolls of copper foil, eliminates the common problems of surface defects on finished laminates, and because of the fine crystal deposit of the first layer eliminates the problems of porosity commonly to be found in electroformed copper foil. Use can be made of polished caul plates which have previously been used in a conventional laminating process.

The total thickness of copper on the press plate is preferably 3 to 12 μm, more preferably about 5 μm.

The first copper layer deposited on the press plate can be very thin, e.g. 1 to 2 μm. It may be deposited by electrolysis, e.g. from a copper cyanide bath or a copper pyrophosphate bath, preferably containing 25 to 35 g/l of copper, 150 to 310 g/l of $P_2O_7$, 1 to 2 g/l ammonia, and having a pH of 8 to 9.

If the first strike of copper is carried out from a near neutral plating bath with high throwing power, and the metal carrier plate has the correct surface finish, the dense crystal structure of the first layer virtually guarantees that the foil as eventually plated will be free from pinholes or micro-porosity. In conventional foil making technology porosity on thin foils is a major problem because the copper foil is plated all from the same bath and, in the interests of economical production and so that a matte structure can be achieved, the bath used is an aqueous copper sulphate solution. Such baths, operated at the high current densities required to achieve economical levels of production, always pose difficulties in maintaining control of the nucleation sites of the copper at the start of the plating process. Micro-contamination of the drum surface or the solution can result in intercrystalline porosity which permits resin bleed through if such material is laminated. Rigorous testing is carried out by the foil producer and laminators so that the high standards required result in high scrap levels in the industry. The production of foil in a multi-stage sheet-by-sheet process as now proposed allows the copper core to be plated at high speed from a similar bath to that used in typical drum foil processes, but the nucleation site problem is avoided by plating this layer after a first strike. The near-neutral pyrophosphate bath also assists in obtaining an oxide free surface on the finished laminate.

Even if a few micro-pores are present in the copper plated on the press plate, resin bleed-through is effectively prevented because there is no space between the copper and the press plate into which the air entrapped in the micro-pores can escape, so that the resin cannot even enter the micro-pores.

EXAMPLE

A press plate consisting of a sheet of titanium 2 mm thick was polished to provide a uniform surface of between 0.1 and 0.2 μm C.L.A. The polished sheet was placed in a plating tank containing copper cyanide solution and plate as described in Table 1 below.

TABLE 1

| | |
|---|---|
| Copper Cyanide | 3.0-16 g/l |
| Sodium Cyanide | 4.5-18 g/l |
| Sodium Carbonate | 2.0-4 g/l |
| Rochelle Salt | 0-6 g/l |
| pH | 12-13 |
| Temperature | 32-82° C. |
| Current Density | 1-7 A/dm$^2$ |
| Time | 3-30 s |

TABLE 1-continued

| Anode Material | Copper or steel |
|---|---|

The plated sheet was removed from the bath and thoroughly washed in a warm water spray. The sheet was then placed in a copper sulphate plating solution, rendered cathodic and plated in conditions as described below in Table 2.

TABLE 2

| | |
|---|---|
| Copper (as metal) | 25-110 g/l |
| Sulphuric acid | 60-110 g/l |
| Temperature | 45-65° C. |
| Current Density | 2-110 A/dm$^2$ |
| Anode Material | Lead Sheet |

The plating time depends on the thickness of copper required.

After the foregoing plating step the sheet was transferred to a further copper sulphate plating bath and subjected to conditions as follows in Table 3. In determining the precise conditions to be used, it is important that copper crystals plated are not of a powdery oxidised character but are pure metallic copper dendrites firmly adherent to the surface.

TABLE 3

| | |
|---|---|
| Copper (as metal) | 15-45 g/l |
| Sulphuric acid | 60-90 g/l |
| Arsenic (as metal) | 200-500 mg/l |
| Temperature | 18-50° C. |
| Anode material | Lead Sheet |
| Current Density | 5-220 A/dm$^2$ |

The sheet was placed in this bath disposed parallel and in close proximity to the lead anode and subjected to a continuous but variable current in a range of time and current densities so as to produce a strongly adherent microcrystalline dendritic deposit of high surface area.

The so plated sheet was removed from the plating bath, thoroughly washed, passitvated in a weak chromic acid solution, washed again, and dried. The total thickness of the plated layer was 12 μm.

This sheet was taken to a laminating press and laid upon 5 sheets of epoxy impregnated glass cloth of a type commonly used in the production of copper clad laminates. After the press had been closed and heat and pressure applied in accordance with the requirements of the resin impregnated base material, the press was allowed to cool and the laminate removed. It was immediately apparent that the titanium sheet had separated from the copper layer and could be lifted off the laminate that had been made; it was ready for return to the initial plating bath.

The resultant laminate demonstrated a particularly clean, stain free copper surface and the copper layer was firmly adherent to the base. The laminate was subjected to test procedures typical for the industry and was found to be satisfactory in every respect.

Instead of the copper cyanide solution specified in Table 1 above, a copper pyrophosphate solution may be used under the following conditions:

| Plating solution: | |
|---|---|
| Copper (as metal) | 30 g/l |
| Pyrophosphate as $P_2O_7$ | 180 g/l |
| Ammonia | 1 g/l |

| | |
|---|---|
| -continued | |
| pH | 8.6–8.8 |
| Temperature | 50–55° C. |
| Current density | 2.2–4.3 A/dm² |
| Anode-cathode gap | 7–12 cm |
| Anode material | copper. |

Potassium hydroxide is used to regulate the pH. The plating time depends on the current density and required thickness (generally 1–2 μm). During the plating process continuous aeration of the anode/cathode interspace is carried out to prevent the copper deposit from 'burning'.

The pH of the bath is regulated continuously to maintain it in the range 8.6–8.8. Variations on either side of these levels may result in copper which adheres too strongly to the press plate or is porous or both.

The process of the invention described above has clear advantages over the prior art process represented by U.S. Pat. No. 3,984,598. In the prior art process a silane release agent has to be used to facilitate removal of the laminate from the caul plate after lamination; even so, it is clear that separation of the laminate from the caul plate does not occur automatically in the laminating press. The known use of temporary (disposable or re-usable) substrates has always required stripping of the foil from the substrate mechanically (i.e. by peeling) or chemically (i.e. by dissolving the substrate). The present invention is a radical departure, in that adhesion between the laminate and the substrate is destroyed during the laminating process, so that the caul plates and laminates can be separated in the same way as conventional caul plates and laminates.

In the present process an initial copper layer substantially free of micro-pores is surmounted by a copper dendritic structure, thereby achieving a copper foil into which the dielectric material can penetrate so as to produce strong bonding (high peel strength) but which foil is impermeable to the dielectric material. In contrast, the prior art process uses a high current density to achieve a copper layer with a rough surface, with the inevitable result that the thin copper layer is micro-porous; furthermore, it is still found necessary to roughen the surface further by oxidization. Such a surface provides a much weaker bond than a dendritic structure.

In the prior art process, after removal of the substrate from the laminate, it is expected that the substrate (caul plate) will still contain the release agent as a thin film. However, there is a risk that the film will become so thin, perhaps locally, that it will no longer facilitate removal of the substrate. Therefore, checking of recycled caul plates would be necessary to ensure that the release layer is continuous and undamaged. The release layer will, in general, be more easily damaged than a polished metallic surface. It will be difficult to detect imperfections in a release layer, whereas imperfections in a polished surface (such as roughening or scratching) are very easily detected.

In order to operate economically, a laminator would use not only copper-clad caul plates (in the production of laminates with very thin copper, i.e. less than 20 μm) but also ordinary polished caul plates with self-supporting copper foil (for producing laminates with thicker copper layers). If a release agent is used (as in the prior art process) there is a risk that caul plates with and without a film of release agent will be mixed up, whereas the present process can make use of polished caul plates which have been used in a conventional laminating process.

What is claimed is:

1. A process for producing copper-clad dielectric boards, comprising the sequential steps of
    (a) depositing a substantially uninterrupted layer of copper substantially free of micro-pores directly on a polished surface of a flat metallic press plate;
    (b) providing the copper layer with a matte surface of copper of dendritic structure;
    (c) bonding the matte surface to a dielectric material while applying heat and pressure to the press plate and the dielectric material in a laminating press and subsequently allowing the press to cool, the forces generated at the interface of the press plate and the copper layer, owing to the penetration of the dielectric material into the dendritic structure under pressure and the subsequent cooling of the dielectric material, being sufficient to overcome the adhesion of the copper layer to the polished surface of the press plate and thereby to cause the copper layer to be detached from the press plate;
    (d) removing the resulting copper-clad dielectric board from the press and separating it from the press plate; and
    (e) returning the press plate to step (a) and repeating steps (a) to (d).

2. A process as claimed in claim 1, in which the press plate is made of stainless steel, titanium, or chromium-plated steel.

3. A process as claimed in claim 1, in which the layer of copper initially deposited on the polished surface is 1 to 2 μm thick.

4. A process as claimed in claim 1, in which the initial copper layer is deposited electrolytically from a copper cyanide solution.

5. A process as claimed in claim 1, in which the initial copper layer is deposited electrolytically from a copper pyrophosphate solution.

6. A process as claimed in claim 1, in which the total thickness of copper on the press plate surface is 3 to 12 μm.

7. A flat metallic press plate having a polished surface on which a substantially uninterrupted layer of copper substantially free of micro-pores has been deposited directly, the copper layer having a matte surface of copper of dendritic structure capable of being bonded to a dielectric material under heat and pressure in a laminating press, the adhesion of the copper layer to the polished surface of the press plate being sufficiently low that the forces generated at the interface of the press plate and the copper layer, owing to the penetration of the dielectric material into the dendritic structure under pressure and the subsequent cooling of the dielectric material, will cause the copper layer to be detached from the press plate.

8. A press plate as claimed in claim 7, made of stainless steel, titanium, or chromium-plated steel.

9. A press plate as claimed in claim 7, in which the total thickness of copper on the press plate surface is 3 to 12 μm.

10. A process for producing copper-clad dielectric boards, comprising the sequential steps of polishing a press plate to have a substantially flat and uniform outer surface of between 0.1 and 0.2 microns center line average (C.L.A.); depositing an uninterrupted layer of copper substantially free of micro-pores directly on said polished surface; providing the copper layer with a matte surface of copper of dendritic structure; bonding the matte surface to a dielectric material while applying heat and pressure to the press plate and the dielectric material in a laminating press and subsequently allowing the press to cool, the forces generated at the interface of the press plate and the copper layer, owing to the penetration of the dielectric material into the dendritic structure under pressure and the subsequent cooling of the dielectric material, being sufficient to overcome the adhesion of the copper layer to the polished surface of the press plate and thereby to cause the copper layer to detach from the press plate; and removing the detached copper-clad dielectric board from the press plate.

11. A process for producing copper-clad dielectric boards, comprising the sequential steps of depositing an uninterrupted layer of copper substantially free of micro-pores directly on a polished surface of a flat metallic press plate; providing the copper layer with a matte surface of copper of dendritic structure; bonding the matte surface to a dielectric material while applying heat and pressure to the press plate and the dielectric material in a laminating press and subsequently allowing the press to cool, the forces generated at the interface of the press plate and the copper layer, owing to the penetration of the dielectric material into the dendritic sturcture under pressure and the subsequent cooling of the dielectric material, being sufficient to overcome the adhesion of the copper layer to the polished surface of the press plate and thereby causing the copper layer to detach from the press plate; and removing the detached copper-clad dielectric board from the press plate.

12. A process for producing copper-clad dielectric boards, comprising the sequential steps of depositing an uninterrupted layer of copper substantially free of micro-pores directly on a polished surface of a flat metallic press plate; providing the copper layer with a matte surface of copper of dendritic structure; bonding the matte surface to a dielectric material while applying heat and pressure to the press plate and the dielectric material in a laminating press and subsequently allowing the press to cool, the forces generated at the interface of the press plate and the copper layer, owing to the penetration of the dielectric material into the dendritic structure under pressure and the subsequent cooling of the dielectric material, being sufficient to overcome the adhesion of the copper layer to the polished surface of the press plate and thereby to cause the copper layer to be detached from the press plate; and removing the resulting copper-clad dielectric board from the press and separating it from the press plate.

* * * * *